United States Patent [19]
Gotoh et al.

[11] Patent Number: 5,976,904
[45] Date of Patent: Nov. 2, 1999

[54] METHOD OF MANUFACTURING SEMICONDUCTOR DEVICE

[75] Inventors: Osamu Gotoh; Kohji Yamada; Hiroki Yaegashi; Hideaki Horikawa, all of Tokyo, Japan

[73] Assignee: Oki Electric Industry Co., Ltd, Tokyo, Japan

[21] Appl. No.: 09/013,038

[22] Filed: Jan. 26, 1998

[30] Foreign Application Priority Data

Jan. 31, 1997 [JP] Japan .................................. 9-033075

[51] Int. Cl.⁶ .................................................. H01L 21/784
[52] U.S. Cl. ................................ 438/33; 438/42; 438/462
[58] Field of Search ........................................ 438/462, 464, 438/465, 32–45

[56] References Cited

U.S. PATENT DOCUMENTS

| | | | |
|---|---|---|---|
| 5,436,196 | 7/1995 | Miyashita | 438/33 |
| 5,567,659 | 10/1996 | Pakulski et al. | 438/32 |
| 5,573,976 | 11/1996 | Kato et al. | 438/42 |
| 5,593,815 | 1/1997 | Ahn | 438/33 |
| 5,601,687 | 2/1997 | Herrick | 438/43 |
| 5,629,233 | 5/1997 | Chand et al. | 438/33 |
| 5,780,320 | 7/1998 | Knoshita | 438/462 |

FOREIGN PATENT DOCUMENTS 6-338657  12/1994  Japan .

*Primary Examiner*—Olik Chaudhuri
*Assistant Examiner*—Anh Duy Mai
*Attorney, Agent, or Firm*—Jones Volentine, L.L.P.

[57] ABSTRACT

A method of manufacturing a semiconductor device for forming with high accuracy a marker used for separating a semiconductor device 10, wherein a plurality of semiconductor devices 10 are fabricated in a semiconductor substrate 16 are separated, and wherein etched grooves 31 are formed outside the semiconductor regions in the semiconductor substrate 16.

7 Claims, 7 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, such as a semiconductor laser, and more particularly to a method of manufacturing a semiconductor device for cutting out accurately each semiconductor device after a plurality of semiconductor devices are fabricated in a semiconductor wafer.

2. Prior Art

In the manufacture of a semiconductor device, such as a semiconductor laser, generally, after a plurality of semiconductor devices are fabricated in the substrate formed of a semiconductor wafer, markers are scribed in the surface of the semiconductor wafer with a scriber. The semiconductor wafer is cleaved along the scribed markers into semiconductor devices.

Among the conventional semiconductors, there is a semiconductor laser having a window structure as disclosed in Japanese Patent Public Disclosure No.06-338657, for example. According to this window structure, window layers for widening the band gap are formed near the end faces of the oscillator of a semiconductor laser, thereby making it possible to suppress the absorption of self-emitting radiation by the laser end faces. Thus, according to the semiconductor laser having the window structure, optical damage or destruction at the end portions of the oscillator can be prevented and the critical emission output can be improved.

The window layers can be formed by forming a multilayer structure for use as a semiconductor laser, then forming U-grooves for the window layers at specified positions, and refilling the U-grooves with a window material. After the window layers are formed, the multilayer structure for a semiconductor laser is subjected to stress and cleaved along planes determined by the crystal structure to thereby divide the window layers in the longitudinal direction of the U-grooves.

Before cleaving, the multilayer structure is scribed with a scriber to form markers in the surface thereof. The scribing accuracy of the scriber is on the order of several tens of μm, whereas the minimum width of the U-groove for the divided window layer is about 10 μm.

Therefore, with the conventional markers scribed with the scriber, it is not easy to obtain workpieces of accurate dimensions, so that variations tend to occur in the thickness dimension of the window layers.

As the scattering loss of the laser light increases with the increasing thickness of the window layers, for which reason the thickness of the window layers of each device to be sliced out should desirably be within a predetermined accuracy of thickness.

Accordingly, the object of the present invention is to provide a method of manufacturing a semiconductor device in which the markers for cleaving the semiconductor devices can be formed with high accuracy.

SUMMARY OF THE INVENTION

According to the present invention, there is provided a method for manufacturing a semiconductor device, comprising the step of cleaving a plurality of semiconductor devices fabricated in a substrate formed of a semiconductor wafer, wherein as the markers for this cleaving process, slective-etched grooves are used which are formed in the region outside the semiconductor devices in a semiconductor substrate including a multilayer structure disposed on the substrate.

The grooves are formed relatively easily by selective etching using a mask, for example, and the mask for selective etching can be formed by photolithography at a specified position with an extremely high accuracy of several μm.

Therefore, the markers can be provided with high accuracy by appropriately forming a selecting mask for slective-etched grooves along desired cleaving lines of semiconductor devices.

Since the etched grooves are not formed so as to transverse in the region of the semiconductor devices, the formation of the etched grooves does not introduce defects, which affect the characteristics of the semiconductor devices, into the semiconductor devices, so that it never happens that the markers formed by the etched grooves cause a deterioration of the characteristics of the semiconductor devices.

When an orientation flat for indicating the direction is provided on the semiconductor wafer, the markers made of etched grooves can be formed in parallel with or at right angles with the orientation flat. Then, it becomes easy to separate the semiconductor devices by cleaving.

For the etched grooves, it is possible to adopt grooves whose cross-sectional contour is in the shape of the letter V, the letter U, an inverted mesa, a normal mesa, or a vertical mesa. However, the V-shaped cross-sectional contour should preferably be adopted for the etched grooves in order that the etched-groove markers can be easily recognized when one looks at the semiconductor multilayer structure from the top surface and in order to cleave the multilayer structure with high accuracy.

When a semiconductor having a surface of the (001) plane is used, the orientation flat can be provided in parallel with <110>.

As the material for the semiconductor wafer, a GaAs compound semiconductor or an InP compound semiconductor may be used.

When a GaAs semiconductor material is used, an etching solution of sulfuric acid or a mixed etching solution of hydrochloric acid and phosphoric acid, exhibiting anisotropic etch characteristics may be used as the etchant of the above-mentioned etching.

When an InP semiconductor material is used, an etching solution of four parts of hydrochloric acid and one part of phosphoric acid, which exhibits anisotropic etch characteristics, may be used as the etchant.

The markers according to the present invention is particularly suitable for the manufacture of a semiconductor laser of a window structure.

A semiconductor laser according to the present invention is a multilayer structure having an active layer as the light-emitting region, in which window layers for suppressing the absorption of light from the light-emitting region are buried in a plurality of U-grooves formed at predetermined positions and mutually space apart, being open at the surface of the multilayer structure, and extending transversing the active region.

The multilayer structure having window layers formed therein is cleaved together with the window layers along certain planes parallel to the extending direction of the U-grooves in which the window layers are buried, so that the end faces of a semiconductor layer open up.

Etch-formed grooves are formed in the window layers as the markers for cleaving out the end faces of the semiconductor devices, and the end faces are disclosed by cleaving the multilayer structure along the etched grooves.

According to the present invention, etched grooves can be provided relatively easily in specified positions in the region of each window layer with a narrow width of about 10 to 80 μm by photolithography and etching. Therefore, it is possible to manufacture semiconductor lasers of a window structure of predetermined dimensions with little variations attributable to manufacturing errors, in other words, semiconductor lasers free of variations in characteristics attending on the dimensional variation of the window structure.

DESCRIPTION OF PREFERRED EMBODIMENTS OF THE INVENTION

Embodiments of the present invention will be described with reference to the accompanying drawings.
<Embodiment 1>

FIGS. 1 to 6 depict an etching mask used for manufacturing a semiconductor laser according to the present invention and also show the method of manufacturing a semiconductor laser using this etching mask.

Prior to describing the manufacturing method by referring to FIGS. 1 to 6, a structure of a semiconductor laser according to the present invention, shown in FIGS. 7 and 8, will first be described.

Figure 7:
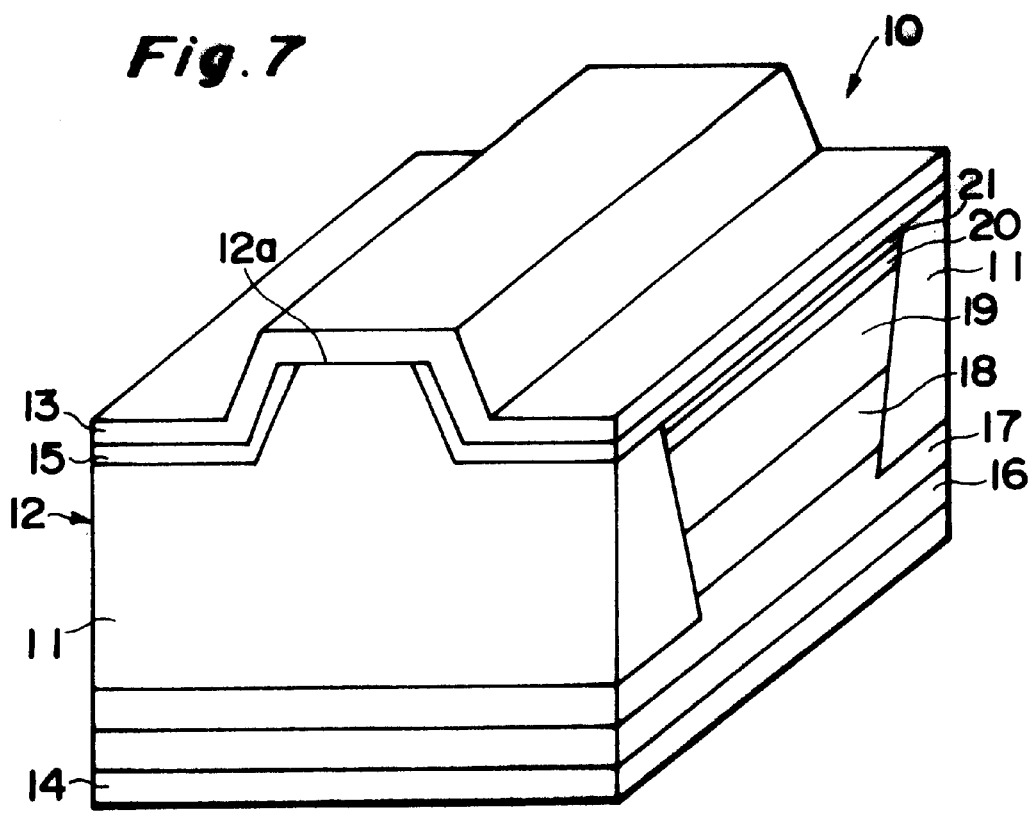
FIG. 7 is a perspective view showing the semiconductor laser according to the present invention.

A semiconductor laser 10 according to the present invention, as shown in FIG. 7, comprises a multilayer structure 12 having window layers 11 buried at each end thereof, and an upper electrode 13 and a lower electrode 14 provided in the multilayer structure 12.

The multilayer structure 12 is formed with its flat underside in contact with the lower electrode 14. At the apex of the multilayer structure 12, there is provided a ridge portion 12a for directing a current to an active layer, to be described later, which extends in a direction of connecting two window layers 11 together, and upper electrodes 13 are deposited on the multilayer structure 12 through the intermediary of insulating films 15 covering the both sides of the ridge portion 12a.

Figure 8:
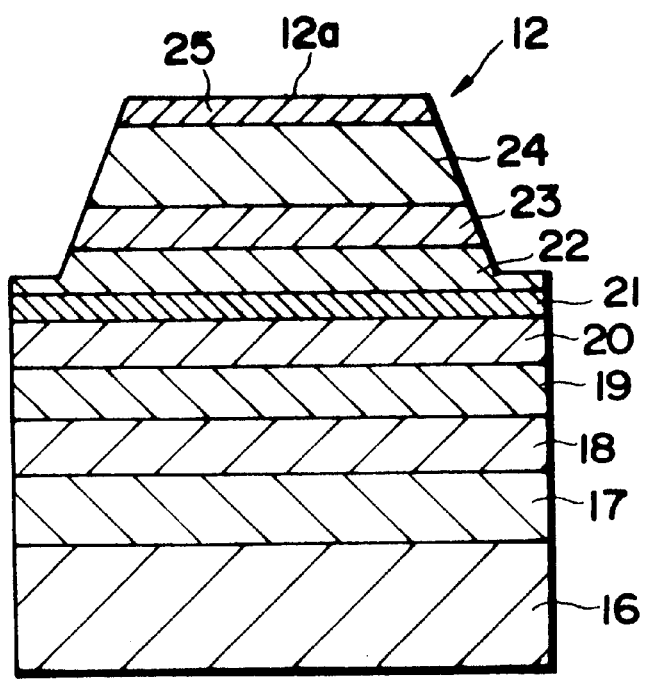
FIG. 8 is a sectional view showing a multiplier structure of the semiconductor laser according to the present invention.

FIG. 8 is a transverse cross section of the multilayer structure 12. As shown in FIG. 8, the multilayer structure 12 includes n+type GaAs substrate 16, and other layers grown successively on the substrate 16, such as n+type AlGaAs buffer layer 17, n type AlGaAs clad layer 18, a guide layer 19, an SCH layer 20, an active layer 21 of a quantum well structure having GaAs/InGaAs/GaAs, an SCH layer 22 formed of p type AlGaAs, a guide layer 23, a clad layer 24, and p+type GaAs contact layer 25. In the example of FIG. 8, the layers 16 to 25 are grown one on another such that their (001) planes are in contact with one another.

The SCH layers 20 and 22 formed above and below the active layer 21 function to effectively confine the photo carriers in the active layer 21. The composition and the functions of the respective layers of the multilayer structure 12, including those SCH layers 20 and 22, are well known, and therefore their detailed descriptions are omitted.

The contact layer 25 at the apex of the ridge portion 12a of the multilayer structure 12 obtains an ohmic contact with the upper electrode 13. As is well known, when a voltage is applied between the upper electrode 13 and the lower electrode 14, a current is injected through the ridge portion 12a into the active layer 21, and a laser beam is emitted from the active layer 21 through the window layer 11.

The window layers 11 are provided at both side ends of the multilayer structure 12, one of them serving as the emitting end of a laser beam. They may be made of AlGaAs, for example. The window layers 11, having a larger band gap energy than that of the active layer 21, can suppress the absorption of the self-emitting radiation by the end faces of the laser 10. Therefore, semiconductor laser 10 of a window structure can prevent optical damage or destruction at the oscillator end portions (11), and can increase the critical light output.

Figure 1:
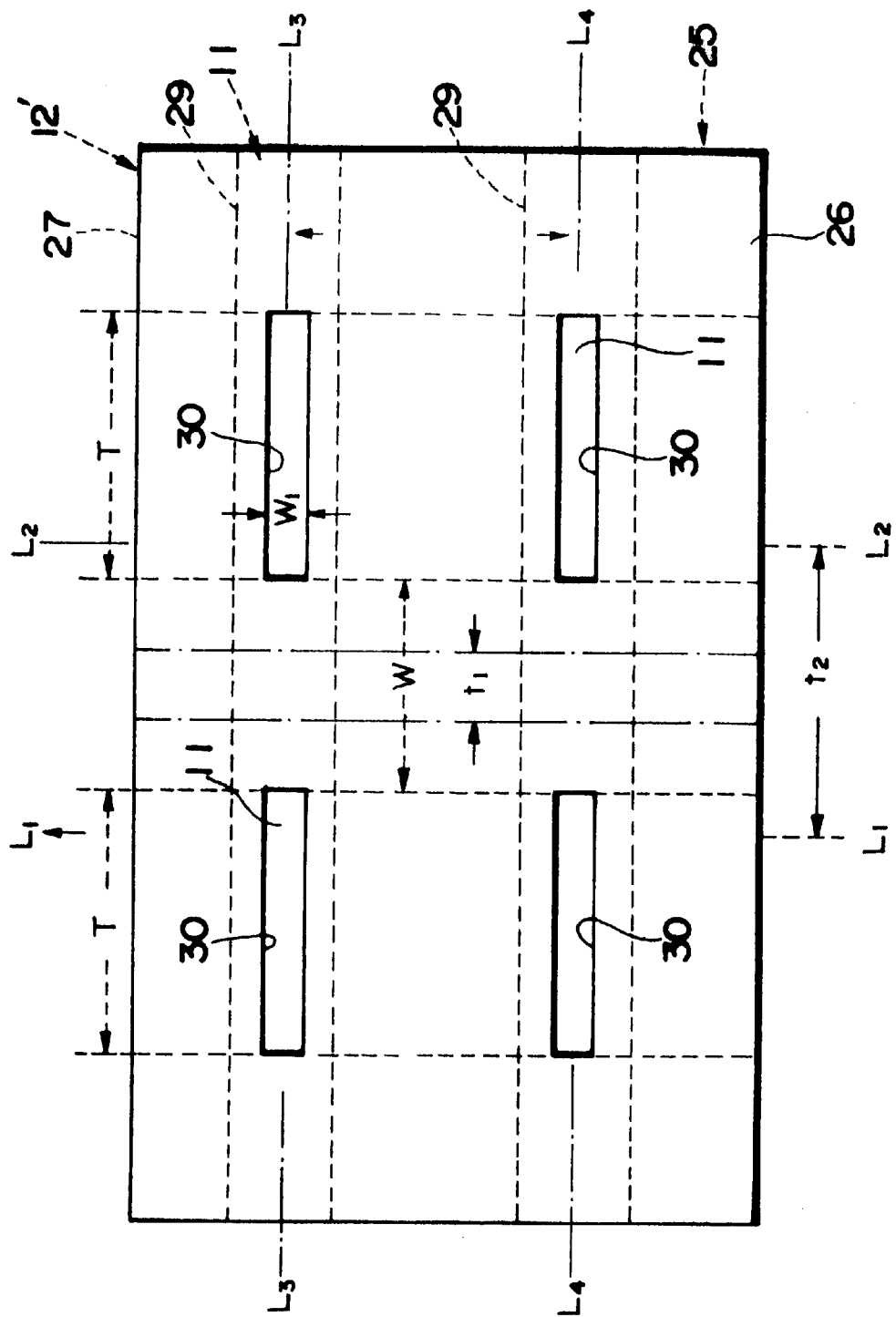
FIG. 1 is a plan view showing an etching mask for a marker used in the method of manufacturing a semiconductor laser according to the present invention.

FIG. 1 shows an etching mask 26 used in the manufacture of the semiconductor laser 10 shown in FIGS. 7 and 8.

Figure 2:
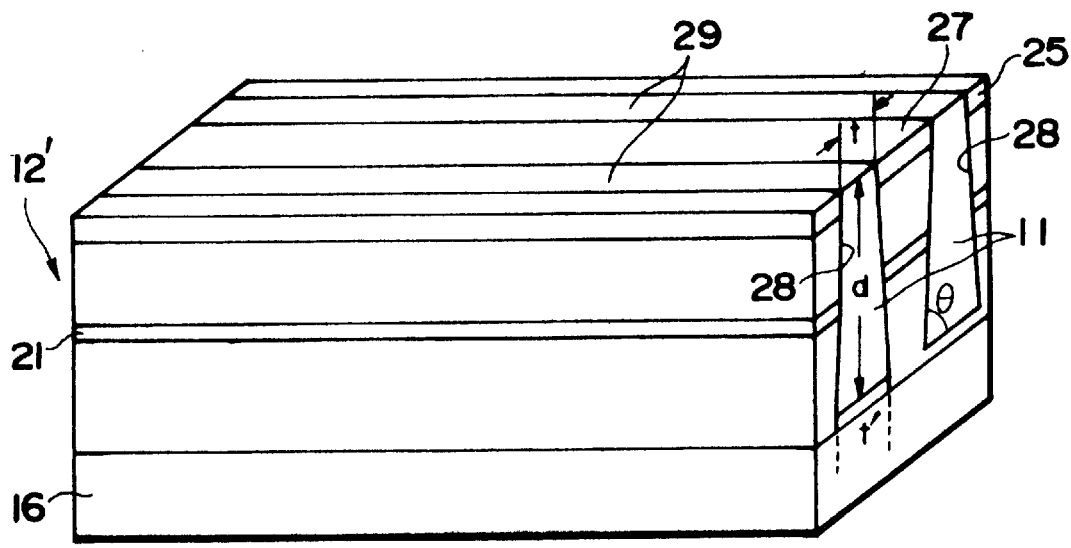
FIG. 2 is a perspective view showing a multilayer structure for a semiconductor laser according to the present invention.

FIG. 2 is a perspective view of a multilayer structure 12' to which this etching mask 26 is applied.

This multilayer structure 12' has a similar structure to that of the multilayer structure 12 in FIG. 8 and, as is well known, can be obtained by epitaxially growing crystal materials of the respective layers 17 to 25 on the substrate 16.

In each of FIGS. 2 to 6, a part of the multilayer structure is omitted for simplicity of the drawings.

In the multilayer structure 12', there are formed U-grooves 28 of an inverted mesa cross section, extending in parallel and mutually spaced apart and being open at the surface of the contact layer 25, which is the top surface of the multilayer structure 12', and a window material for the window layers 11 is filled back into the U-grooves 28 by epitaxial growth, for example.

The U-grooves 28, the transverse cross section of which is an inverted mesa shape, each have a width t of 10 μm to 80 μm, and are open at the surface 27 of the contact layer 25. The bottom end portion of each U-groove 28 has a depth d passing through the active layer 21 and reaching the buffer layer 17. The bottom end width t' of the U-groove 28 is larger than the open end width t because the cross section of the U-groove 28 in the illustrated example is an inverted mesa.

The window layers 11 filled in the U-grooves have a pair of stripe zones 29 thereof with a width t exposed at the surface 27 of the contact layer 25.

The etching mask 26 is used to form etched grooves along the stripe zones 29 on the surface 27 of the multilayer structure 12'.

As shown in FIG. 1, the etching mask 26 is obtained by first growing an insulating film of silicon oxide or silicon nitride, for example, which is a mask material, to cover the surface of the multilayer structure 12' and then forming openings 30 by photolithography and etching.

The openings 30 are formed in the central portion of the stripe zone 29 of each window layer 11 extending in the longitudinal direction of the zone 29 and separated by a distance W.

In the example in FIG. 1, the width t1 of the ridge portion 12a is 5 μm, and the semiconductor device width, in other words, the laser chip width t2 represented by line L1—L1 and line L2—L2 in FIG. 1 is 350 μm. This example shows a case where there is a space of about 500 μm as an interdevice space, that is, between the laser chip widths t2. The openings 30 are formed in the non-device regions T between the laser chip widths t2.

The width W1 of the opening 30, through which the window layer 11 is partially exposed, can be 6 μm, for example, when the width t of the stripe zone 29 is 10 μm. An etching mask 26 having openings 30 such as was described can be formed relatively easily by photolithography and etching which have been well known. The openings 30 can be formed with high accuracy at specified positions in the center portions of the stripe zones 29.

The openings 30 are etched away by selective etching through an etching mask 26 having the openings 30. For this etching, an etching solution including $H_2SO_4$, $NH_4OH$ or $H_3PO_4$. Instead of wet etching with an etching solution, dry etching can be adopted.

Figure 3:
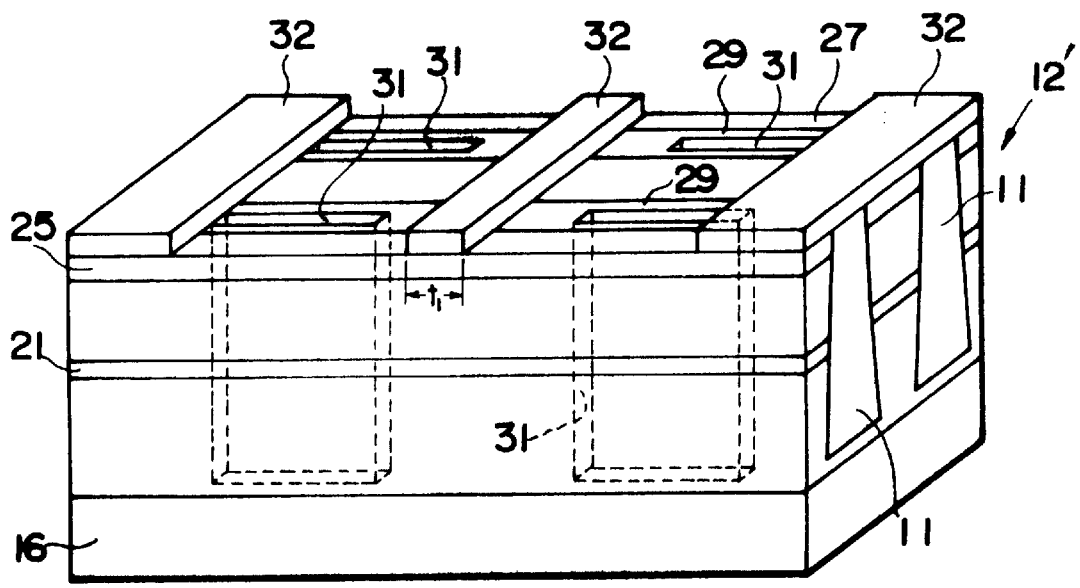
FIG. 3 is a perspective view showing a masking process for forming ridge portions of the multilayer structure according to the present invention.

By selective etching using an etching mask 26, as shown in FIG. 3, in the specified positions of the stripe zones 29 of the multilayer structure 12', etched grooves 31 are formed extending downwardly and to a depth deeper than the bottom portions of the U-grooves 28 for the window layers 11. The etched grooves 31 may be to such a depth as to reach the substrate 16.

After forming the etched grooves 31, as shown in FIG. 3, the etching mask 26 is removed with a buffered hydrofluoric acid (BHF), for example, and on the surface 27 of the multilayer structure 12' after the removal of the mask 26, a new mask for forming the ridge portions is formed to cover the device regions which include the region t1 for forming the ridge portion 12a.

Figure 4:
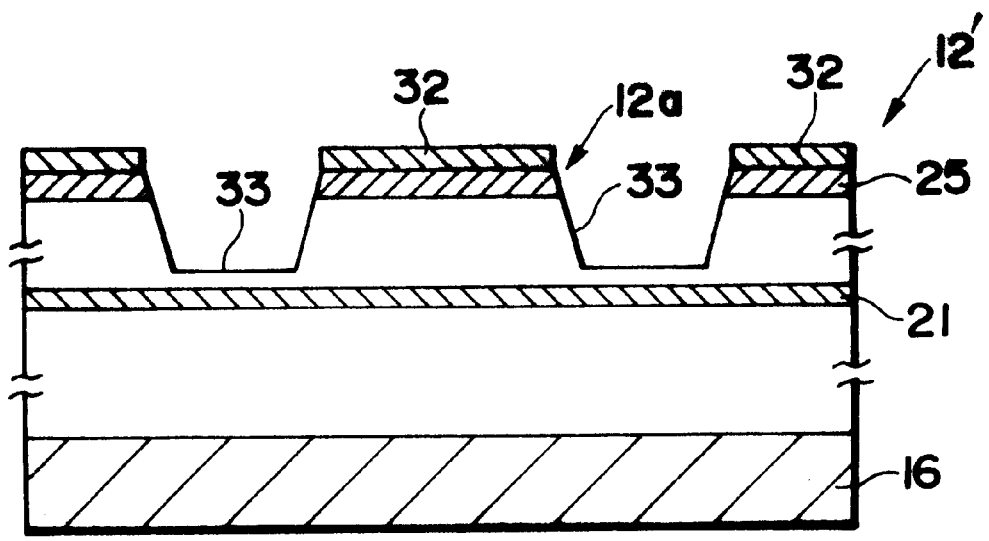
FIG. 4 is a sectional view showing an etching process for forming ridge portions of the multilayer structure according to the present invention.

By selective etching using the ridge forming mask 32, as shown in FIG. 4, U-grooves 33 are formed which extend to the SCH layer 22 but do not reach the active layer 21, whereby the ridge portion 12a is defined between the U-grooves 33. The depth of the U-grooves 33 is decided in consideration of the transverse mode.

As is well known, the U-grooves 33 for defining the ridge portion 12a may be formed by either dry or wet etching.

Figure 5:
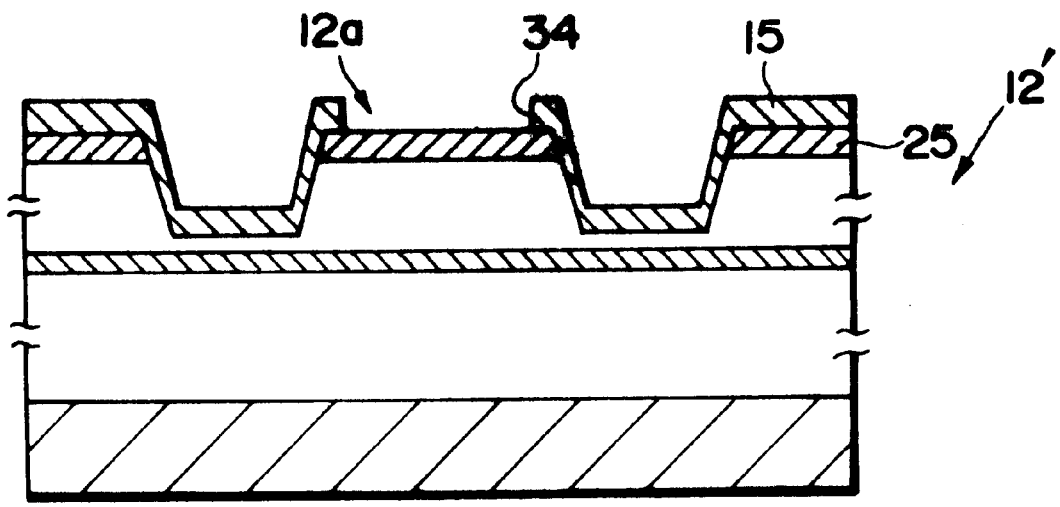
FIG. 5 is a sectional view showing a process for forming an insulating layer and a contact hole in the multilayer structure according to the present invention.

After the formation of the U-grooves 33 for defining the ridge portion 12a, the ridge forming mask 32 is removed as shown in FIG. 5. After this, an insulating film 15 is grown by sputtering, for example, on the surfaces of the contact layer 25 and the U-grooves 33. A contact hole 34 is formed at the apex of the ridge portion 12a of the insulating film 15 to expose the contact layer 25.

Figure 6:
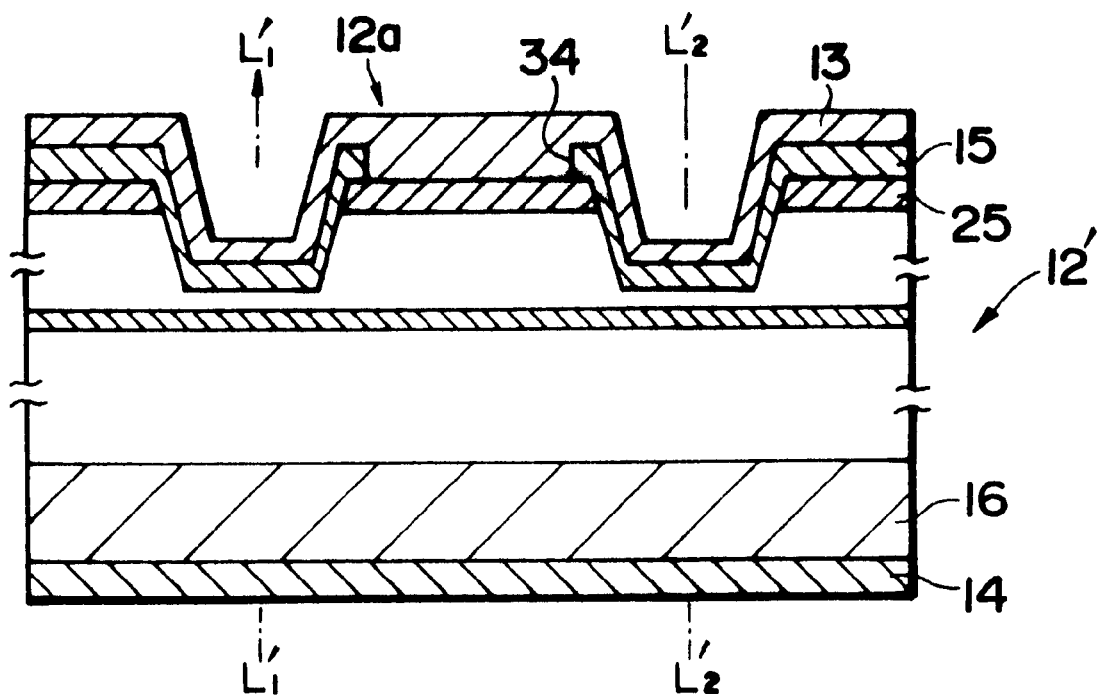
FIG. 6 is a sectional view showing a process for forming electrodes in the multilayer structure according to the present invention.

After the formation of the contact hole 34, as shown in FIG. 6, an upper electrode 13, which is connected through the contact hole 34 to the contact layer 25 at the ridge portion 12a, is formed by depositing Cr/Au or Ti/Pt/Au, for example.

On the other hand, a lower electrode 14 is formed by depositing, for example, Au/Ge/Ni on the underside of the substrate 16.

Then, the multilayer structure 12', on which the ridge portion 12a and the two electrodes 13 and 14 have been formed, is sliced off at its side faces on the edges of the ridge portion 12a of a semiconductor laser 10, including line L1—L1 and line L2—L2 shown in FIG. 1 (along the planes including line L'1—L'1 and line L'2—L'2, respectively in FIG. 6).

Further, the multilayer structure 12' is cut along line L3—L3 and line L4—L4 in the longitudinal direction of the etched grooves 31 extending in the window layers 11 so as to cut the window layers 11 shown in FIG. 1 longitudinally.

In cutting the multilayer structure 12' along line L1—L1 and line L2—L2 (line L'1—L'1 and line L'2—L'2 in FIG. 6), in other words, in cutting off a semiconductor laser 10 in the longitudinal direction of the semiconductor laser 10, because a high cutting accuracy is not required like in the prior art, after scribe marks are made with a scriber, the multilayer structure can be cleaved along line L1—L1 and line L2—L2.

On the other hand, in cutting the multilayer structure 12' in the longitudinal direction of the ridge portion 12a in which the window layers 11 are split in the thickness direction, because the multilayer structure 12' has already been cleaved by utilizing the etched grooves 31 produced in the window layers 11, a semiconductor laser 10 is cut out.

In the method of manufacturing a semiconductor laser 10 according to the present invention, as has been described, before cutting the multilayer structure 12' in the thickness direction of the window layers 11, because the splitting planes are defined by the etched grooves 31 formed with high accuracy in the window layers 11, the multilayer structure 12' can be cleaved along the etched grooves 31 as the markers without a scribing action with a scriber unlike in the prior art.

Note that the etched grooves 31 never cut across the central portion of each semiconductor laser 10, which includes the ridge portion 12a in the device region. Therefore, the provision of the etched grooves 31 prevents damage to the portions of the semiconductor laser 10 which are associated with light emission.

Accordingly, it is possible to cut out a semiconductor laser 10 including window layers 11 with a predetermined thickness with high accuracy without incurring the deterioration of the emission characteristics of the semiconductor laser 10, so that a semiconductor laser 10 with stable characteristics can be fabricated relatively easily.

In the formation of the etching mask 26 by photolithography, when the depth of the U-groove 28 is d and the rising angle θ of the inverted mesa shape is 55 degrees as shown in FIG. 2, the manufacturing error margin X of the mask is obtained as $X = d/\tan \theta (\mu m) = 0.7d$ ($\mu m$).

Therefore, because the error margin X is about 3.5 μm when the depth d of the U-groove 28 is 5 μm, an etching mask 26 in which the width of the openings 30 is 4 μm can be adopted for the narrow window layer 11 whose width is 5 μm, the width of the window layer 11 to be cut out can be controlled precisely with an accuracy of 5 μm or less.

In the first embodiment, after the formation of the etched grooves 31 as the markers, the ridge portion 12a is formed by etching using the mask 32. By reversing the order, the ridge portion 12a may be formed first and then the markers 31 may be formed later.

<Embodiment 2>

In the example shown in FIGS. 1 to 6, description has been made of a case where the etching process for forming the ridge portion 12a and the etching process for etched grooves 31 are executed separately. However, if an etching mask 26' shown in FIG. 9 is used, these two etching processes can be performed with this single etching mask 26', so that the manufacturing process can be thus simplified.

Like in the etching mask 26, after an insulating film of silicon oxide or silicon nitride, for example, is formed on the surface of the multilayer structure 12' shown in FIG. 2, the etching mask 26' can be obtained by partially removing the insulating film.

Figure 9:
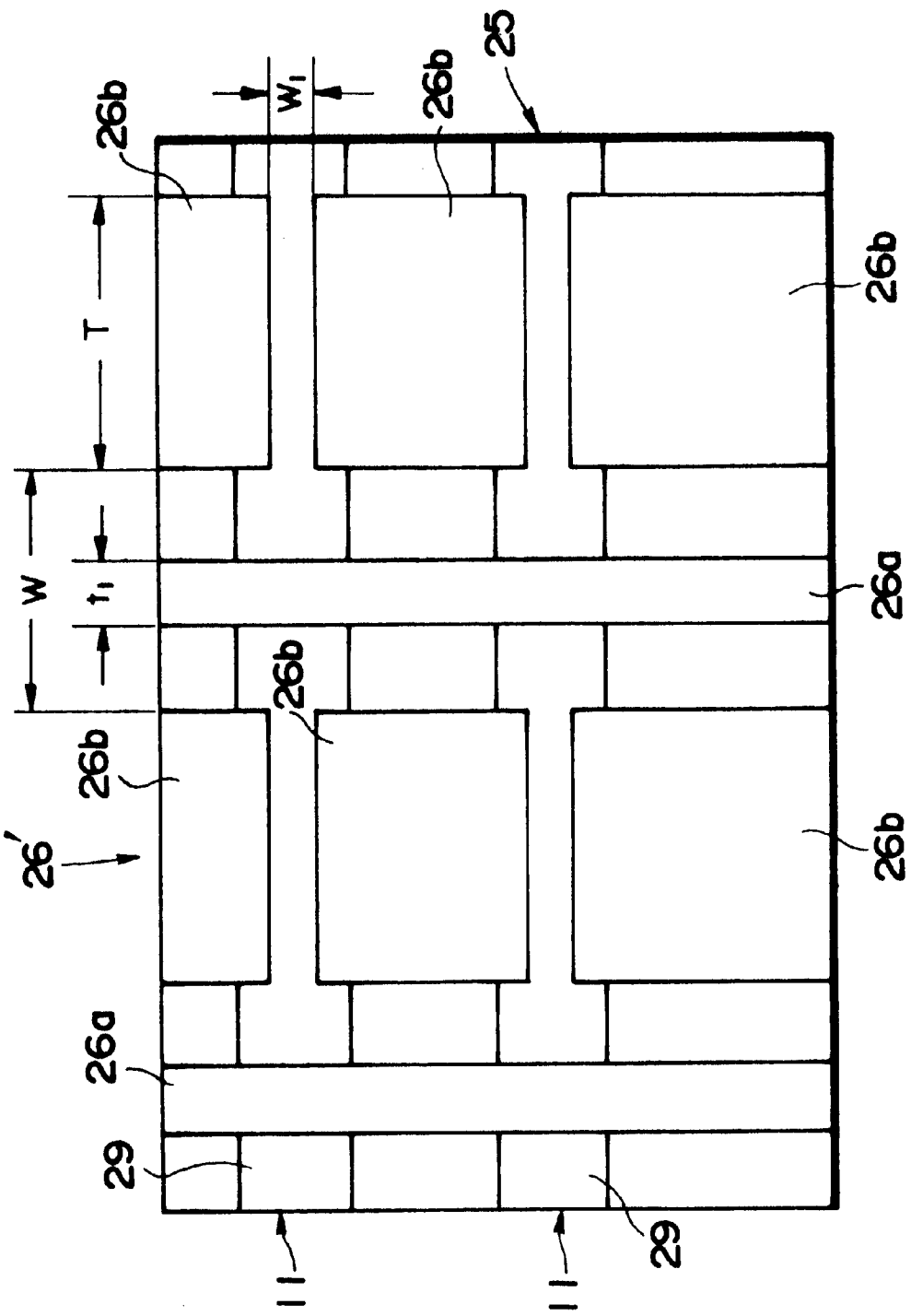
FIG. 9 is a plan view showing another embodiment of the etching mask for a marker according to the present invention.

The etching mask 26', as shown in FIG. 9, includes a plurality of first mask portions 26a formed mutually separated a certain distance from each other so as to cover the ridge portions 12a, and a plurality of second mask portions 26b formed between the first mask portions 26a and separated a certain distance from the first mask portions 26a.

The second mask portions 26b are formed between the first mask portions 26a, arranged in the longitudinal direction of the first mask portions 26a and, in cooperation with the adjacent second mask portions 26b, partially cover both sides of the stripe zones 29, but have the central portions of the stripe zones 29 exposed in the space shared with the adjacent second mask portions 26b.

A group of second mask portions 26b, aligned to each other and respectively separated a certain distance from the first mask portions 26a, are arranged between the adjacent first mask portions 26a on both sides thereof.

The multilayer structure 12', to which the etching mask 26' is applied, has the exposed portions thereof on either side of the first mask portions 26a by dry etching or wet etching. As a result, the U-grooves 33 as shown in FIG. 4 are formed, whereby the ridge portion 12a is defined between the adjacent U-grooves 33.

The portions of the stripe zones 29, which are exposed between the second mask portions 26b, are etched away, whereby the etched grooves 31 are formed which have a depth substantially equal to the depth of the U-grooves 33.

Therefore, according to the second embodiment, the ridge portions 12a and the etched grooves 31 are formed simultaneously without providing an etching mask for the ridge portions 12a and an etching mask for the etched grooves 31 and without performing those etching processes separately, so that the manufacturing method according to the present invention can be performed more effectively.

In the example described, description has been made of a case of cleaving the multilayer structure by using the etched grooves 31 as the markers without using a scriber. However, by using the etched grooves 31 as the guide for the edge of the scriber, stribe marks can be made with the scriber for accurate cleaving.

Figure 10:
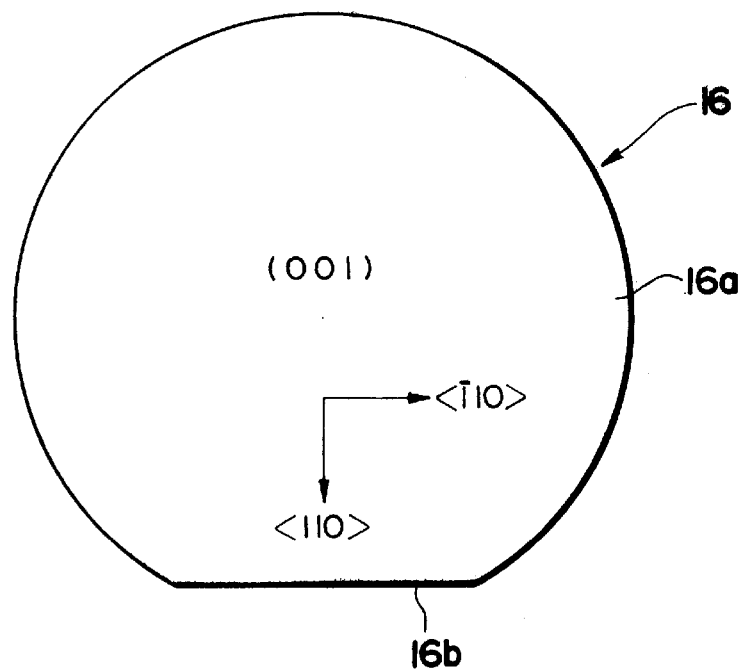
FIG. 10 is a plan view of the semiconductor wafer 16.
Figure 11A:
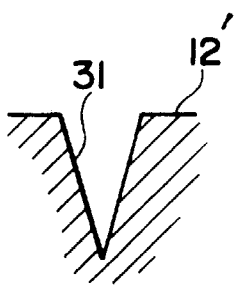
FIGS. 11a to 11e are cross-sectional views of the etched grooves according to the present invention.
Figure 11B:
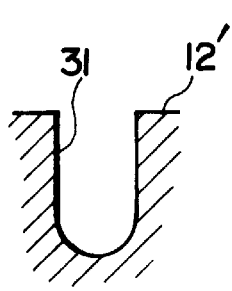
Figure 11C:
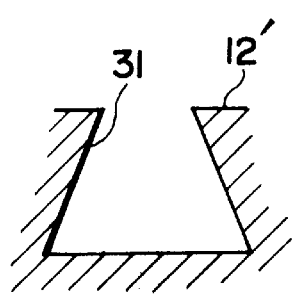
Figure 11D:
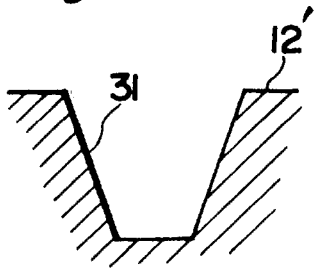
Figure 11E:
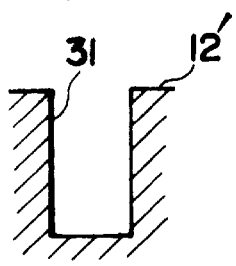

Let us suppose that a compound semiconductor wafer having a surface 16a of a (001) plane and an orientation flat 16b in parallel with the <110>axis as shown in FIG. 10, for example, is used as the semiconductor substrate 16a. In this case, the extending direction of the etched grooves 31 on the surface 27 of the multilayer structure 12' parallel with the wafer surface 16a should preferably be formed to be parallel with or at right angles with the orientation flat 16b. By arranging the etched grooves as described, the device 10 can be separated easily by cleaving mentioned above.

For the etched grooves, grooves 31 having the cross-sectional contour of any of various shapes, such as the letter V, the letter U, a normal mesa, an inverted mesa, and a vertical mesa as shown in FIGS. 11(a)–(e), may be adopted.

Among them, the V-shaped cross-sectional contour should preferably be adopted for the etched grooves in order to facilitate the recognition of the etched-groove markers when looking at the semiconductor multilayer structure from the top surface and in order to achieve highly accurate cleaving of the multilayer structure.

The accuracy of the cleavage along the V-shape etched grooves 31, the widths W1 of which are 50, 100, 200 and 500 $\mu$m at the surface 27 of the multilayer structure 12', is checked. As a result, in all of the V-grooves, accurate cleavages were obtained which occurred along the intersecting lines of the two sloping surfaces defining the V-grooves.

When a GaAs compound semiconductor is used as the material of the multilayer structure 12', an etching solution of sulfuric acid or a mixed etching solution of hydrochloric acid and phosphoric acid may be used as the etchant. They exhibit anisotropic etch characteristics to GaAs semiconductor materials, so that in this multilayer structure 12', V-shape etched grooves can be formed which are defined by lattice planes, of which a typical low-index plane is a (111) plane.

When an InP semiconductor is used as the semiconductor material of the multilayer structure 12', an etching solution of four parts of hydrochloric acid and one part of phosphoric acid, which exhibits anisotropic etch characteristics may be used as the etchant. By use of this etchant, V-shape etched grooves can be formed which are defined by lattice planes, of which a typical low-index plane is a (211) plane.

The present invention can be applied to the manufacture of various types of semiconductor devices requiring high accuracy with which the devices are separated, in addition to the manufacture of semiconductor lasers of a window structure.

For example, length is an important parameter semiconductor modulators. More specifically, with the modulator, as its length is increased, the absorption becomes large, and the modulation characteristics are better. But on the other hand, in proportion to the increase in the length, the electrode area is larger and the capacity is larger, too, with the result that the high frequency characteristics deteriorate.

To obtain a modulator with desired characteristics as designed, it is necessary to control the length of the produced modulator with high accuracy. This holds true with a laser with a modulator achieved by high integration of a laser and a modulator. This invention can be applied to the manufacture of various types of semiconductor devices which need to be cut out with high accuracy.

According to the present invention, as described above, grooves are formed at desired positions to be used as separation lines relatively easily and with high accuracy by selective etching using a mask, for example, and the markers can be provided accurately by using the grooves, and accurate-sized semiconductor devices can be separated relatively easily.

Because the etched grooves used as the markers do not transverse the semiconductor regions when they are formed, defects affecting the characteristics of the semiconductor device are not introduced into the semiconductor device, so that the characteristics of the semiconductor device can be prevented from being degraded by the markers.

According to the method of manufacturing a semiconductor laser in the present invention, by applying the present invention to the manufacture of a semiconductor laser of a window structure, a semiconductor of a window structure with little dimensional variation caused by manufacturing errors. Thus, it becomes possible to manufacture a semiconductor laser free of variation in characteristics attributable to the dimensional variation of the window structure.

What is claimed is:

1. A method of manufacturing semiconductor laser devices having a multilayer structure including a window structure and having a light emitting region as an active region, the method comprising:

forming a plurality of grooves at predetermined positions, the grooves being open at the surface of said multilayer structure and extending transversly across said active region;

burying window layers, in said window structure, for suppressing the absorption of light from said light-emiting region in the plurality of grooves;

forming etched grooves as cleaving markers in said window layers by selective etching using a mask having openings for partially exposing the surface portions of said window layers, said mask additionally including a portion for covering a ridge portion of said multilayer structure to define said ridge portion, said ridge portion and said grooves being formed simultaneously by said selective etching; and separating end faces of said semiconductor laser devices by cleaving said multilayer structure along said etched grooves.

2. The method of manufacturing a semiconductor laser devices according to claim 1, wherein said etched grooves are formed outside of said light emitting regions in said multilayer structure.

3. The method of manufacturing a semiconductor device according to claim 1, further comprising using a GaAs compound semiconductor for said semiconductor laser devices, and using sulfuric acid etchant or a mixed etchant of phosphoric acid and hydrocloric acid which exhibits anistropic etch characteristics for said selective etching.

4. The method of manufacturing a semiconductor device according to claim 1, further comprising using an InP compound semiconductor, and wherein an etching solution of four parts of hydrocloric acid and using one part phosphoric acid that exhibits anisotropic etch characteristics used for said selective ecthing.

5. The method of manufacturing a semiconductor device according to claim 1, wherein said etched grooves extend at right angles with longitudinal direction of said ridge port.

6. The method of manufacturing a semiconductor device according to claim 1, wherein said etched grooves have one of a cross sectional contour of the letter V, the letter U, a normal mesa, an inverted mesa, and a vertical mesa.

7. The method of manufacturing a semiconductor device according to claim 1, wherein said forming of said etched grooves includes etching said etched grooves deeper than a depth of said plurality of grooves.

* * * * *